United States Patent
Nguyen et al.

(10) Patent No.: US 11,823,423 B2
(45) Date of Patent: Nov. 21, 2023

(54) METHODS AND SYSTEMS FOR COMPRESSING SHAPE DATA FOR ELECTRONIC DESIGNS

(71) Applicant: Center for Deep Learning in Electronics Manufacturing, Inc., San Jose, CA (US)

(72) Inventors: Thang Nguyen, San Jose, CA (US); Ajay Baranwal, Dublin, CA (US); Michael J. Meyer, Palo Alto, CA (US)

(73) Assignee: Center for Deep Learning in Electronics Manufacturing, Inc., San Jose, CA (US)

( * ) Notice: Subject to any disclaimer, the term of this patent is extended or adjusted under 35 U.S.C. 154(b) by 6 days.

(21) Appl. No.: 17/453,609

(22) Filed: Nov. 4, 2021

(65) Prior Publication Data

US 2022/0058836 A1 Feb. 24, 2022

Related U.S. Application Data

(63) Continuation of application No. 16/793,152, filed on Feb. 18, 2020, now Pat. No. 11,182,929.
(Continued)

(51) Int. Cl.
*G06N 3/0455* (2023.01)
*G06F 30/398* (2020.01)
(Continued)

(52) U.S. Cl.
CPC ............ *G06T 9/002* (2013.01); *G06F 30/398* (2020.01); *G06N 3/0455* (2023.01); *G06T 7/0006* (2013.01)

(58) Field of Classification Search
CPC .......... G06N 3/045; G06N 3/08; G06N 20/00; G06N 20/10; G06N 3/02; G06N 3/0455;
(Continued)

(56) References Cited

U.S. PATENT DOCUMENTS 6,501,083 B1 12/2002 Kamijo
8,938,696 B1 1/2015 Torunoglu et al.
(Continued)

FOREIGN PATENT DOCUMENTS

CN 109102497 A 12/2018
CN 110603625 A * 12/2019 .......... G06K 9/6203
(Continued)

OTHER PUBLICATIONS

Search Machine translation to He of CN 110603625, retrieved Jan. 14, 2023, 45 pages. (Year: 2023).*
(Continued)

*Primary Examiner* — Matthew C Bella
*Assistant Examiner* — Dennis Rosario
(74) *Attorney, Agent, or Firm* — MLO, a professional corp.

(57) ABSTRACT

Methods for compressing shape data for a set of electronic designs include inputting a set of shape data, where the shape data comprises mask designs. A convolutional autoencoder encodes the set of shape data, where the encoding compresses the set of shape data to produce a set of encoded shape data. The convolutional autoencoder is tuned for increased accuracy of the set of encoded shape data based on design rules for the set of shape data. The convolutional autoencoder comprises a set of parameters comprising weights, and the convolutional autoencoder has been trained to determine what information to keep based on the weights.

25 Claims, 8 Drawing Sheets

Related U.S. Application Data

(60) Provisional application No. 62/810,127, filed on Feb. 25, 2019.

(51) Int. Cl.
*G06T 9/00* (2006.01)
*G06T 7/00* (2017.01)

(58) Field of Classification Search
CPC ........ G06N 3/0464; G06T 2207/20084; G06T 2207/20081; G06T 7/0004; G06T 2207/30148; G06T 9/002; G06T 2207/30168; G06T 2207/10061; G06T 2207/20021; G06T 3/4046; G06T 7/0002; G06T 9/00; G06T 2207/30108; G06T 2207/30141; G06V 10/82; G06V 10/454; G06V 10/50; G06V 10/22; G06V 2201/06; G06V 10/32; G06V 10/70; G06V 30/18057; H01L 29/7869; H01L 27/10844; H01L 21/28; H01L 21/02; H01L 29/401; H01L 21/268; H01L 27/1288; H01L 27/1052; G06F 18/217; G06F 30/27; G06F 30/30; G06F 30/398; G05B 19/4183; G05B 19/4184; G05B 23/0221; G05B 2219/33331; G05B 19/41885; G05B 13/027; G05B 13/0285; G05B 2219/33027; G06Q 50/04; B25J 9/163

See application file for complete search history.

(56) References Cited

U.S. PATENT DOCUMENTS

| | | | | |
|---|---|---|---|---|
| 10,248,663 | B1* | 4/2019 | Keisler | G06F 16/5854 |
| 10,657,213 | B2 | 5/2020 | Ungar | |
| 10,733,744 | B2 | 8/2020 | Ha et al. | |
| 10,740,607 | B2 | 8/2020 | Mei | |
| 2001/0052107 | A1* | 12/2001 | Anderson | G06F 30/398 716/52 |
| 2004/0003357 | A1 | 1/2004 | Palusinski et al. | |
| 2008/0070414 | A1 | 3/2008 | Shiraishi | |
| 2014/0341462 | A1 | 11/2014 | Sezginer et al. | |
| 2014/0358830 | A1 | 12/2014 | Chiang et al. | |
| 2015/0089459 | A1* | 3/2015 | Liu | G06F 30/398 716/53 |
| 2015/0255730 | A1 | 9/2015 | Chuang et al. | |
| 2015/0261908 | A1 | 9/2015 | Hsieh et al. | |
| 2015/0379185 | A1 | 12/2015 | Morisaki et al. | |
| 2016/0132627 | A1 | 5/2016 | Tsai et al. | |
| 2016/0163035 | A1 | 6/2016 | Chang et al. | |
| 2016/0174902 | A1* | 6/2016 | Georgescu | G06V 10/454 600/408 |
| 2016/0349608 | A1 | 12/2016 | Zhang et al. | |
| 2017/0148226 | A1 | 5/2017 | Zhang et al. | |
| 2017/0345140 | A1 | 11/2017 | Zhang et al. | |
| 2018/0096094 | A1 | 4/2018 | Huang et al. | |
| 2018/0173090 | A1 | 6/2018 | Wang et al. | |
| 2018/0218487 | A1* | 8/2018 | Mitarai | G06N 5/048 |
| 2018/0285510 | A1 | 10/2018 | Lutich | |
| 2018/0293721 | A1 | 10/2018 | Gupta et al. | |
| 2018/0322234 | A1 | 11/2018 | Cao et al. | |
| 2018/0330511 | A1* | 11/2018 | Ha | G06V 10/7715 |
| 2019/0057244 | A1 | 2/2019 | Mei | |
| 2019/0171223 | A1 | 6/2019 | Liang et al. | |
| 2019/0182280 | A1 | 6/2019 | Marca et al. | |
| 2019/0188840 | A1 | 6/2019 | Kwon et al. | |
| 2019/0287230 | A1 | 9/2019 | Lu et al. | |
| 2019/0371450 | A1* | 12/2019 | Lou | G16H 20/40 |
| 2020/0073636 | A1 | 3/2020 | Cammarota et al. | |
| 2020/0111238 | A1* | 4/2020 | Covell | G06T 7/0002 |
| 2020/0134461 | A1* | 4/2020 | Chai | G06N 3/04 |
| 2020/0184137 | A1 | 6/2020 | Tsutsui et al. | |
| 2020/0201286 | A1 | 6/2020 | Fujimura et al. | |
| 2020/0226742 | A1 | 7/2020 | Sawlani et al. | |
| 2020/0272865 | A1 | 8/2020 | Niewczas et al. | |
| 2020/0294224 | A1 | 9/2020 | Shaubi et al. | |
| 2020/0327408 | A1* | 10/2020 | Ro | G16H 50/30 |
| 2020/0327416 | A1 | 10/2020 | Baker et al. | |
| 2022/0335333 | A1* | 10/2022 | Cao | G06N 3/047 |

FOREIGN PATENT DOCUMENTS

| | | | | |
|---|---|---|---|---|
| EP | 3392712 A1 | 10/2018 | | |
| JP | 2018124990 A | * 8/2018 | | G06F 17/16 |
| KR | 1020160100842 A | 8/2016 | | |
| TW | 201819896 A | 6/2018 | | |
| TW | 201901293 A | 1/2019 | | |
| TW | 202006848 A | * 2/2020 | | G06F 17/5081 |
| WO | 2018033363 A1 | 2/2018 | | |
| WO | WO-2019219826 A1 | * 11/2019 | | G03F 1/84 |
| WO | WO-2019238976 A1 | * 12/2019 | | G06K 9/4628 |

OTHER PUBLICATIONS

Search Machine translation to Hirosuke of JP 2018-124990, retrieved Jan. 14, 2023, 49 pages. (Year: 2023).*

Search Machine translation to Leu of TW 202006848, retrieved Jan. 14, 2023, 71 pages. (Year: 2023).*

U.S. Appl. No. 62/900,887 to Cao of US 2022/033533, Sep. 16, 2019, 41 pages. (Year: 2019).*

Chamain et al., Faster and Accurate Classification for JPEG2000 Compressed Images in Networked Applications, Sep. 4, 2019 [ retrieved Jan. 14, 2023], Cornell University: arXiv [open-access archive], 9 pages. Retrieved: https://arxiv.org/abs/1909.05638 (Year: 2019).*

Search Machine Translation II: Method For Learning-based Positioning Images Obtained By Different Modalities Of of CN 110603625 A to HE et al., translated May 19, 2023, 47 pages. (Year: 2023).*

Office Action dated Dec. 1, 2021 for Austria Patent Application No. A 9073/2020.

Baranwal et al.,"Five Deep Learning Recipes for the Mask Making Industry," SPIE Photomask Technology Conference, Monterey, CA, Sep. 16, 2019, 33 pages.

Baranwal et al., "Five Deep Learning Recipes for the Mask-Making Industry," Photomask Technology 2019, vol. 1148, Oct. 25, 2019, 19 pages, https://doi.org/10.1117/12.2538440.

Chen et al., Design and Acceleration of Convolutional Neural Networks on Modern Architectures, May 8, 2021 [retrieved May 8, 2021 ], report, 23 pages. Retrieved: https://www.jics.tennessee.edu/files/images/recsem-reu/2018/dnn/Report. pdf (Year: 2021).

Ding, Duo et al., "Machine Learning based Lithographic Hotspot Detection with Critical-Feature Extraction and Classification",IEEE Xplore, 2009.

International Search Report dated Jun. 10, 2020 for PCT Patent Application No. PCT/IB2020/051496.

International Search Report dated Jun. 9, 2020 for PCT Patent Application No. PCT/IB2020/051495.

Lin et al., Data Efficient Lithography Modeling With Transfer Learning and Active Data Selection, Aug. 7, 2018 (1st public dissemination) [rel: May 8, 2021], IEEE Trans on Com-Aid Desi Integral Cir, vol. 38, Issue 10, Oct. 2019, pp. 1900-1913. Retrieved: Doi: 10.1109/TCAD.2018.2864251 (Year: 2018).

Lin et al., Machine Learning for Yield Learning and Optimization, 2018 IEEE International Test Conference, Oct. 29- Nov. 1, 2018 [ retrieved May 8, 2021, 10 pages. Retrieved: https://ieeexplore.ieee.org/abstracl/documenl/8624733 (Year: 2018).

Ma et al., A Machine Learning Based Morphological Classification of 14,245 Radio AGNs Selected from the Best-Heckman Sample , Feb. 1, 20192 [retrieved May 8, 2021], The Astrophysical Journal, vol. 240, No. 2, 21 pages. Retrieved: https://iopscience.iop.org/article/10.384 7 /1538-4365/aaf9a2/meta (Year: 2019).

Notice of Allowance and Fees dated Jul. 28, 2021 for U.S. Appl. No. 16/793,152.

Notice of Allowance and Fees dated Oct. 27, 2021 for U.S. Appl. No. 16/793,390.

(56) References Cited

OTHER PUBLICATIONS

Office Action dated Jan. 8, 2021 for U.S. Appl. No. 16/793,152.
Office Action dated Jul. 22, 2021 for U.S. Appl. No. 16/793,390.
Office Action dated May 14, 2021 for U.S. Appl. No. 16/793,152.
Pang et al., "Enhancing ILT process window using curvilinear mask patterning: dual mask-wafer simulation—How GPU-accelerated simulation enables applied deep learning for masks and wafers ," SPIE Advanced Lithography Conference, San Jose CA, Feb. 26, 2019, 25 pages.
Wetteland, Classification of histological images of bladder cancer using deep learning, thesis, Jun. 2017 [retrieved May 8, 2021], University of Stavanger, Norway, 77 pages. Retrieved: https://uis.brage.unil.no/uis-xmlui/handle/11250/2455555 (Year: 2017).
Yu, Yen-Ting et al. "Machine-Learning-Based Hotspot Detection Using Topological Classification and Critical Feature Extraction", IEEE Transactions On Computer-Aided Design of Integrated Circuits and Systems, vol. 34, No. 3, Mar. 2015.
Official Letter and Search Report dated Jun. 26, 2023 for Taiwan Patent Application No. 109105924.

\* cited by examiner

METHODS AND SYSTEMS FOR COMPRESSING SHAPE DATA FOR ELECTRONIC DESIGNS

RELATED APPLICATIONS

This application is a continuation of U.S. patent application Ser. No. 16/793,152, filed on Feb. 18, 2020, and entitled "Methods and Systems for Compressing Shape Data for Electronic Designs"; which claims priority to U.S. Provisional Patent Application No. 62/810,127, filed on Feb. 25, 2019, and entitled "Methods and Systems for Compressing Shape Data for Semiconductors or Flat Panel Displays or Their Mask Designs, Simulations or Manufactured Shapes"; all of which are fully incorporated herein by reference.

BACKGROUND

The present disclosure is related to lithography, and more particularly to the design and manufacture of a surface which may be a reticle, a wafer, or any other surface, using charged particle beam lithography.

Three common types of charged particle beam lithography are unshaped (Gaussian) beam lithography, shaped charged particle beam lithography, and multi-beam lithography. In all types of charged particle beam lithography, charged particle beams shoot energy to a resist-coated surface to expose the resist.

In lithography the lithographic mask or reticle comprises geometric patterns corresponding to the circuit components to be integrated onto a substrate. The patterns used to manufacture the reticle may be generated utilizing computer-aided design (CAD) software or programs. In designing the patterns, the CAD program may follow a set of pre-determined design rules in order to create the reticle. These rules are set by processing, design, and end-use limitations. An example of an end-use limitation is defining the geometry of a transistor in a way in which it cannot sufficiently operate at the required supply voltage. In particular, design rules can define the space tolerance between circuit devices or interconnect lines. The design rules are, for example, used to ensure that the circuit devices or lines do not interact with one another in an undesirable manner. For example, the design rules are used so that lines do not get too close to each other in a way that may cause a short circuit. The design rule limitations reflect, among other things, the smallest dimensions that can be reliably fabricated. When referring to these small dimensions, one usually introduces the concept of a critical dimension. These are, for instance, defined as the important widths or areas of a feature or the important space between two features or important space areas, those dimensions requiring exquisite control.

One goal in integrated circuit fabrication by optical lithography is to reproduce the original circuit design on a substrate by use of a reticle, in which the reticle, sometimes referred to as a mask or a photomask, is a surface which may be exposed using charged particle beam lithography. Integrated circuit fabricators are always attempting to use the semiconductor wafer real estate as efficiently as possible. Engineers keep shrinking the size of the circuits to allow the integrated circuits to contain more circuit elements and to use less power. As the size of an integrated circuit critical dimension is reduced and its circuit density increases, the critical dimension of the circuit pattern or physical design approaches the resolution limit of the optical exposure tool used in conventional optical lithography. As the critical dimensions of the circuit pattern become smaller and approach the resolution value of the exposure tool, the accurate transcription of the physical design to the actual circuit pattern developed on the resist layer becomes difficult. To further the use of optical lithography to transfer patterns having features that are smaller than the light wavelength used in the optical lithography process, a process known as optical proximity correction (OPC) has been developed. OPC alters the physical design to compensate for distortions caused by effects such as optical diffraction and the optical interaction of features with proximate features. Resolution enhancement technologies performed with a reticle include OPC and inverse lithography technology (ILT).

OPC may add sub-resolution lithographic features to mask patterns to reduce differences between the original physical design pattern, that is, the design, and the final transferred circuit pattern on the substrate. The sub-resolution lithographic features interact with the original patterns in the physical design and with each other and compensate for proximity effects to improve the final transferred circuit pattern. One feature that is added to improve pattern transference is referred to as "serifs." Serifs are small features that enhance precision or resiliency to manufacturing variation of printing of a particular feature. An example of a serif is a small feature that is positioned on a corner of a pattern to sharpen the corner in the final transferred image. Patterns that are intended to print on the substrate are referred to as main features. Serifs are a part of a main feature. It is conventional to discuss the OPC-decorated patterns to be written on a reticle in terms of main features, that is features that reflect the design before OPC decoration, and OPC features, where OPC features might include serifs, jogs, sub-resolution assist features (SRAFs) and negative features. OPC features are subject to various design rules, such as a rule based on the size of the smallest feature that can be transferred to the wafer using optical lithography. Other design rules may come from the mask manufacturing process or, if a character projection charged particle beam writing system is used to form the pattern on a reticle, from the stencil manufacturing process.

As a result, with the increase of circuit elements and the addition of features to enhance printability, the integrated circuit manufacturing industry has been experiencing a "data explosion." In addition, the amount of data used to represent all the details of the patterns is constantly growing as the manufacturing technology advances into subsequent technology nodes. The data volume becomes a serious issue for storage, transfer and processing and requires constant innovation to keep data processing feasible.

Image compression using standard methods of encoding and decoding the compressed image for integrated circuit data is insufficient for many reasons. The amount of data involved would take too much time and the data loss would be significant. An encoding that can completely replicate the original input exactly is lossless. An encoding that replicates the original input with some data loss is lossy. A typical JPEG compression algorithm uses a linear function to down sample an image by looking at pixels in the neighborhood and storing the resulting differences. The JPEG compression algorithm also has a quantization phase which uses an encoding tree such as Huffman coding. While JPEG compression can be lossless, it can take a long time to process the data in either direction. However, image compression using machine learning techniques can encode and decode compressed images efficiently enough to be useful, even if the compression is lossy.

In the manufacture of integrated circuits using a photomask, manufacture of the photomask containing the original circuit design is a critical step of the process. The final photomask must be defect-free, within a pre-determined tolerance, since any defect on the photomask will be reproduced on all wafers manufactured using that photomask. Due to limitations of materials and processes, most or all newly-fabricated photomasks will have imperfections. In a process called mask inspection, a newly-fabricated photomask is analyzed to find imperfections. Each of these imperfections, or potential defects, is then further analyzed to determine if the imperfection is a real defect that will cause a defect on wafers manufactured with this photomask. Imperfections that are identified as real defects can be repaired in a subsequent process called mask repair to create a defect-free photomask suitable for manufacturing wafers.

SUMMARY

In some embodiments, methods for compressing shape data for a set of electronic designs include inputting a set of shape data, where the shape data comprises mask designs. A convolutional autoencoder encodes the set of shape data, where the encoding compresses the set of shape data to produce a set of encoded shape data. The convolutional autoencoder is tuned for increased accuracy of the set of encoded shape data based on design rules for the set of shape data. The convolutional autoencoder comprises a set of parameters comprising weights, and the convolutional autoencoder has been trained to determine what information to keep based on the weights.

In some embodiments, methods for training a convolutional autoencoder for compression of shape data for a set of electronic designs include inputting a set of shape data, wherein the set of shape data comprises mask designs. A set of parameters including a set of convolution layers for a convolutional autoencoder is input. The set of parameters is determined using design rules for the set of electronic designs. The set of parameters comprises weights. The set of shape data is encoded to compress the set of shape data, using the set of convolution layers of the convolutional autoencoder, to produce a set of encoded shape data. The set of parameters is adjusted, wherein the set of parameters is tuned for increased accuracy of the set of encoded shape data based on the design rules for the set of electronic designs. The adjusting comprises adjusting the weights to retain important information needed to reproduce the input set of shape data.

DETAILED DESCRIPTION

Conventionally, hundreds of terabytes of data may be required to represent the mask pattern for a large integrated circuit. Standard compression techniques are not feasible because the computation time would be too long. Mask writers work in the nanosecond order of time (or even less), and keeping up prohibits the use of compression because there is not time to decompress with any standard techniques. However, in the present disclosure, data compression by way of machine learning through a neural network, as illustrated in FIG. 1, can produce a more useful method of compression.

Figure 1:
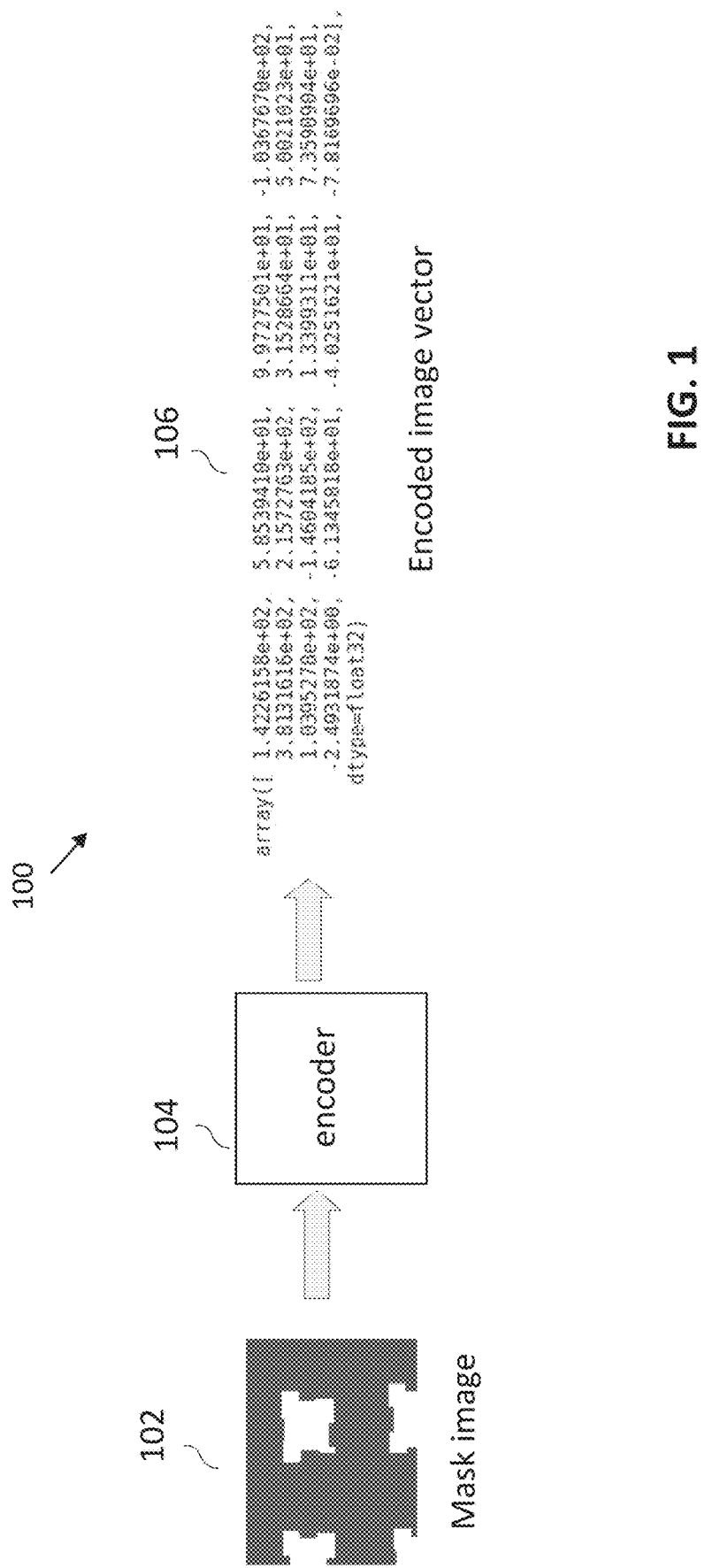
FIG. 1 is a representation of image data as compressed encoding, in accordance with some embodiments.

FIG. 1 is a diagram 100 of encoding of a mask or wafer image 102. Once mask image 102 is compressed by an encoder 104 derived from neural network-based machine learning, the compressed data 106 (illustrated as an encoded image vector in this embodiment), along with a decoder, can be used to reproduce the original image.

Figure 2:
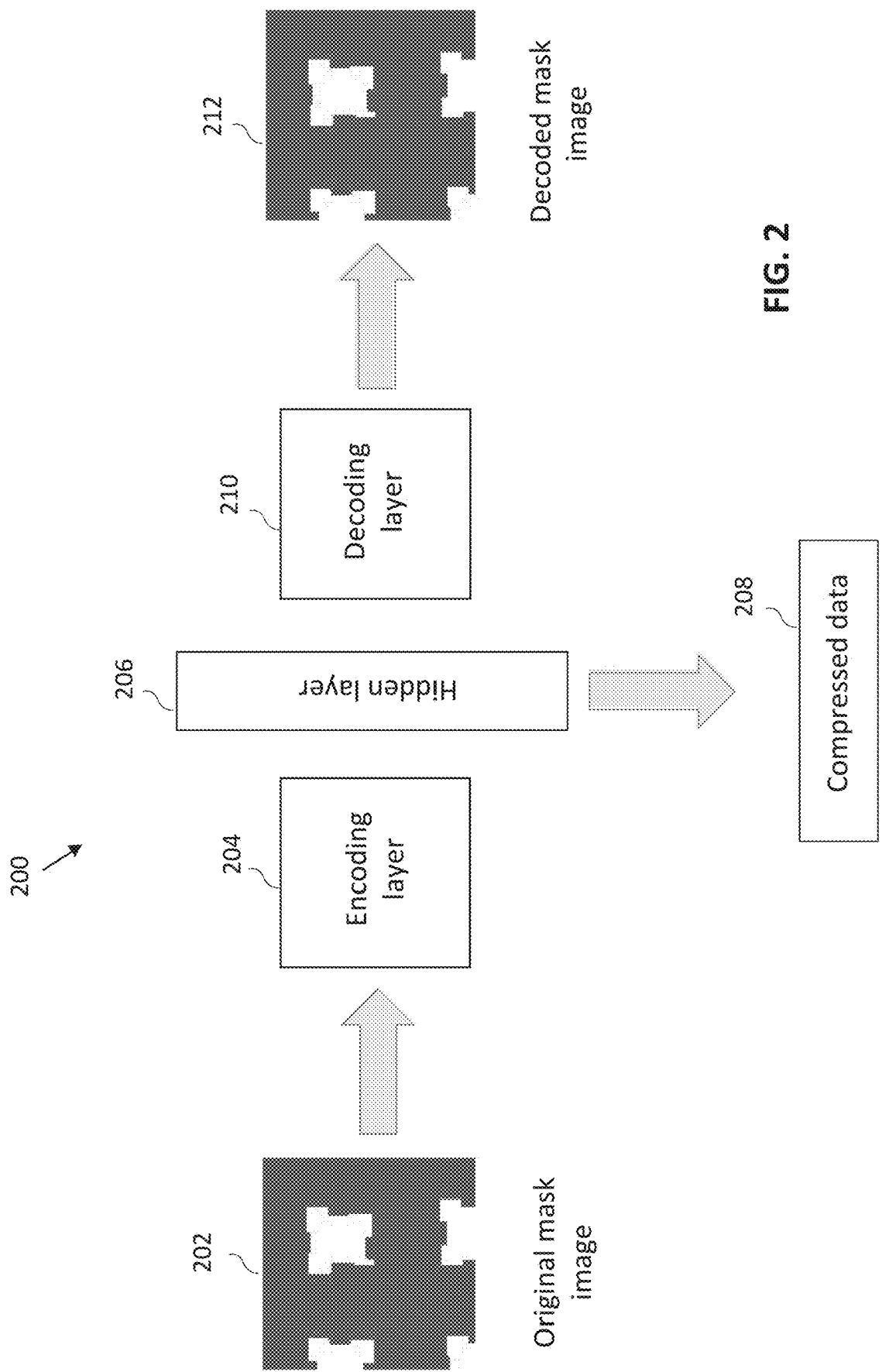
FIG. 2 is a diagram of a 3-layer autoencoder, in accordance with some embodiments.

A neural network is a framework of machine learning algorithms that work together to predict inputs based on a previous training process. In the present embodiments, an encoder is trained using machine learning (i.e., a neural network), where the encoder may also be referred to in this disclosure as an autoencoder (AE). A diagram of an autoencoder 200 is shown in the schematic of FIG. 2, which uses a wafer or mask image as input 202. The autoencoder 200 may include a feed-forward neural network and can be constrained to produce a smaller data representation in a hidden layer 206 than the input 202 (original mask image). The input 202 may also be referred to as shape data for a set of electronic designs, where the shape data represents a set of shapes for a pre-determined device fabrication process. The device fabrication process may be, for example, a semiconductor fabrication process or a flat panel display fabrication process, where the process can include mask designs, simulations or manufactured shapes. The autoencoder 200 comprises an encoder 204 (encoding layer) and a hidden layer 206 that produces an encoding of compressed data 208. The compressed data 208 (which may also be referred to in this disclosure as encoded shape data) can then be decoded by decoder 210 (decoding layer) to produce output 212 (decoded mask image) that is nearly identical to the input 202.

The autoencoder 200 generates compressed data 208 through training, by comparing the decoded mask image 212 to the input 202 and calculating a loss value. The loss value is a cost function, which is an average of the losses from multiple data points. For example, a loss may be calculated for each data point, then the average of these losses corresponds to the cost (loss value). In some embodiments, batch gradient descent may be used where for one training cycle, "n" losses for "n" training instances is calculated, but only one cost is used in determining the parameter update. In some embodiments, stochastic gradient descent may be used, where the parameter update is calculated after each loss (and thus the loss effectively corresponds to the cost). The encoded compressed data 208 retains only information needed to reproduce the original input, within a pre-determined threshold, using decoder 210. For example, the autoencoder may set parameters to weight more important information, such that training allows the neural network to learn what information to keep based on those weights. Retaining only information that is needed to reproduce the original input can reduce calculation time and therefore improve processing efficiency.

Autoencoding depends heavily on the representation of the data. Autoencoding learns non-linear dependencies across local pixels by using convolutional filtered data maps and performs dimensionality reduction from a high dimensional image, such as 240×240 pixels, to an encoded vector (e.g., a vector of 256 elements). The reduction may be performed incrementally at each layer, such as going from 240×240×1 to 120×120×32 so that half the pixels are represented in 32 filtered data. In addition, since images that are similar tend to have encoded vectors that are more similar than images that are different, in some embodiments the encoded vector can be used instead of the original input.

Figure 3:
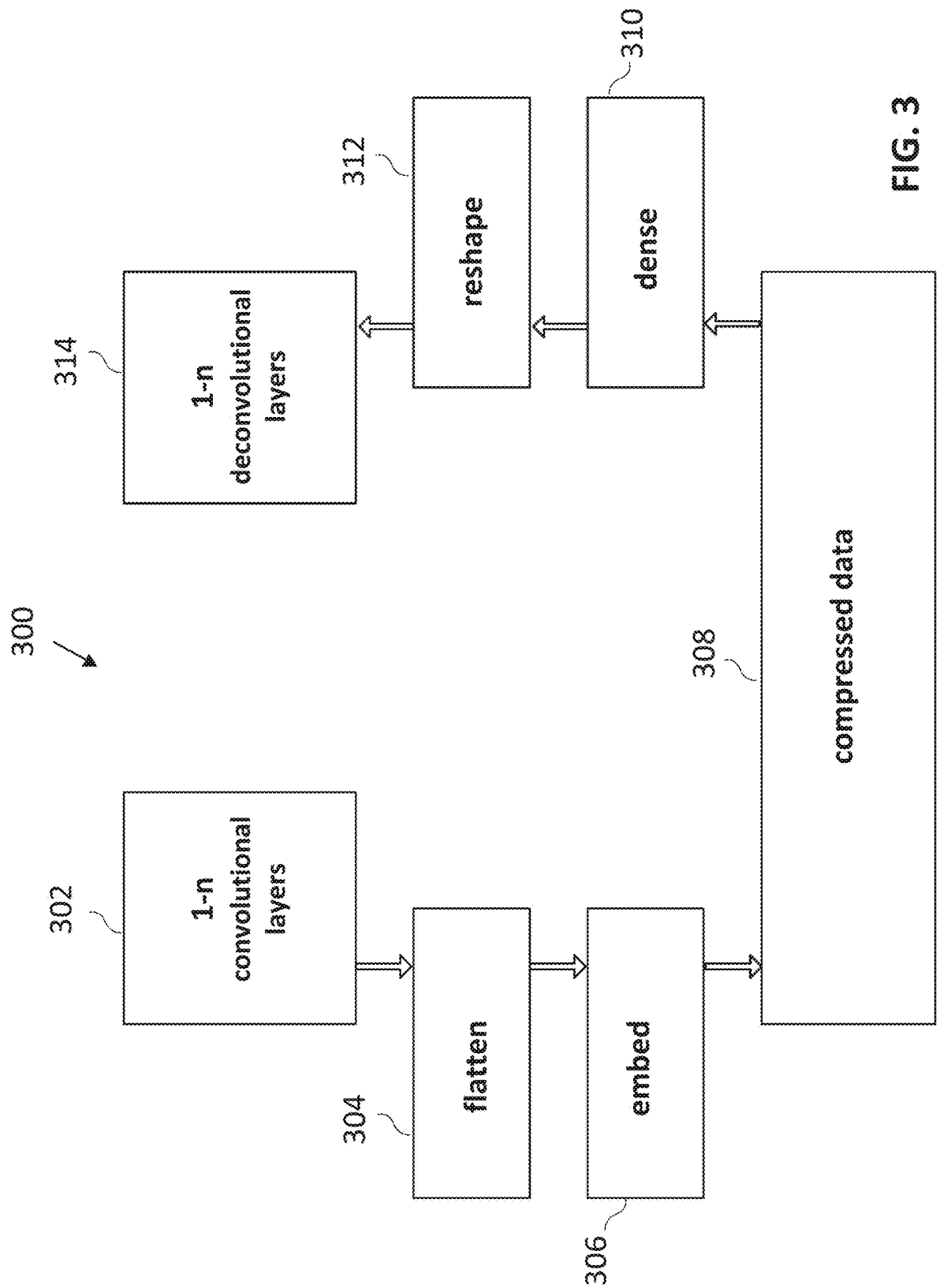
FIG. 3 is a diagram of convolutional autoencoding adapted for mask data compression, in accordance with some embodiments.

In another embodiment an autoencoder with variable convolutional layers is provided in FIG. 3 A convolutional autoencoder model structure 300 has a network of convolutional layers 302 (one or more layers, e.g. up to "n" convolutional layers) for encoding the input image (e.g., input 202 of FIG. 2). Model structure 300 also includes a network of transposed convolutional (deconvolutional) layers 314 for decoding compressed data 308. The autoencoder, through training, learns and determines the optimal number of convolutional layers. For example, methods of the present disclosure may include initializing a set of parameters for the autoencoding model, decoding the encoded shape data using the convolutional autoencoder 300, comparing the decoded data with the input shape data and adjusting the set of parameters. The encoding and decoding are then repeated until the model parameters result in an acceptable accuracy, such as a pre-determined threshold for data loss (e.g., maximum amount of data loss) or when adjustment of parameters is no longer able to achieve further improvement in the loss value. In some embodiments, the number of convolutional layers may be kept below a certain value to help prevent overfitting the model.

The autoencoder 300 begins with outputting filtered data maps of the input image from the convolutional layers 302. The filtered data maps are flattened in a flattening step 304 in preparation for embedding 306. In some embodiments, the embedding 306 involves a fully-connected embedding layer which outputs a one-dimensional vector, where the embedded layer may be, for example, a single fully-connected embedding layer. Decoding of the compressed data 308 occurs in reverse of the encoding steps (flattening 304 and embedding 306), starting with a fully connected dense layer 310. In the reshape step 312 a multidimensional vector output from the dense layer 310 is then reshaped into another multidimensional matrix for further decoding in the deconvolutional layers 314. Like the autoencoder 200 of FIG. 2, the resulting decoded image (e.g., output 212 of FIG. 2) is compared to the original input to calculate a data loss value.

Figure 4:
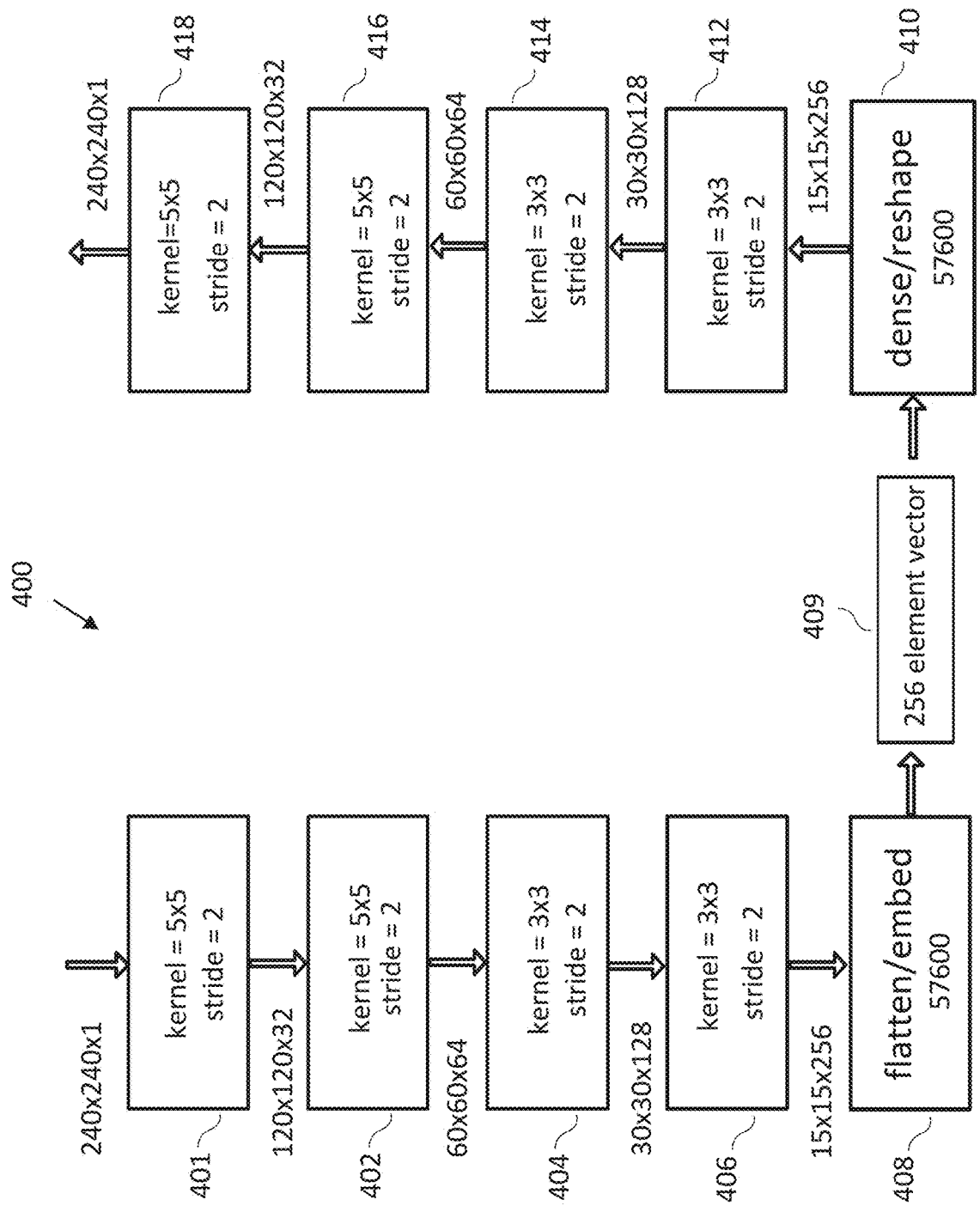
FIG. 4 shows details of encoding and decoding, in accordance with some embodiments.

A more detailed embodiment of the layers in autoencoder 300 is provided in FIG. 4. For this embodiment, the encoder/decoder 400 uses four convolutional layers 401, 402, 404, 406 each taking (in this example) an input image of 240×240 pixels, in this case, and having a kernel size of 5×5, 5×5, 3×3, 3×3, a stride of 2 and a filter size of 32, 64, 128, 256, for each layer respectively. Convolutional layers 401, 402, 404, 406 correspond to convolutional layers 302 of FIG. 3. For some convolutional layers "same" padding is used to add zeros to the input image boundaries which allow filtered data dimensions to be computed. For some convolutional layers "valid" padding is used where some information at the boundary of the input image is allowed to be lost. The number of filtered data is increased in convolutional layers 401, 402, 404 and 406, to capture key elements, then flattened and embedded in step 408. In some embodiments, an embedding layer (step 408) and a dense layer (step 410) are fully connected with hidden units which are flattened (in step 408) and reshaped (step 410) using an element vector 409 as the output of step 408 and the input of step 410. For example, element vector 409 is a 256 element, one-dimensional vector, and the embedding layer and the dense layer are fully connected with 57600 hidden units. In some embodiments, the deconvolutional layers 412, 414, 416, 418 that follow the convolution layers each have a kernel size: 3×3, 3×3, 5×5, 5×5, a stride of 2 and filter size 128, 64, 32, 1, respectively. Deconvolutional layers 412, 414, 416, 418 correspond to deconvolution layers 314 of FIG. 3. In other embodiments, other kernel sizes, strides and filter sizes may be used such as those appropriate for the size and content of the input image. In some embodiments, the number of layers is learned, and the autoencoder uses that number of layers along with the parameters that result in the least amount of loss.

In some embodiments, training can be stopped when the calculated loss value ceases to improve. It is difficult for machine learning to be completely lossless because machine learning is a statistical method that also depends on the training input completeness. The training process of the convolutional autoencoder 300 comprises monitoring and adjusting parameters that allow the encoder/decoder 400 to match the output with input with minimal data loss. The test of this loss is to encode and decode and compare the original against the roundtrip result. In some embodiments, Mean Square Error (MSE) may be used as the metric (i.e., cost function or loss value) for comparison and calculation of data loss, or alternatively a similar Root Mean Square Error (RMSE) loss function may be used. In further embodiments, other loss functions may be chosen as appropriate for the domain.

Figure 5B:
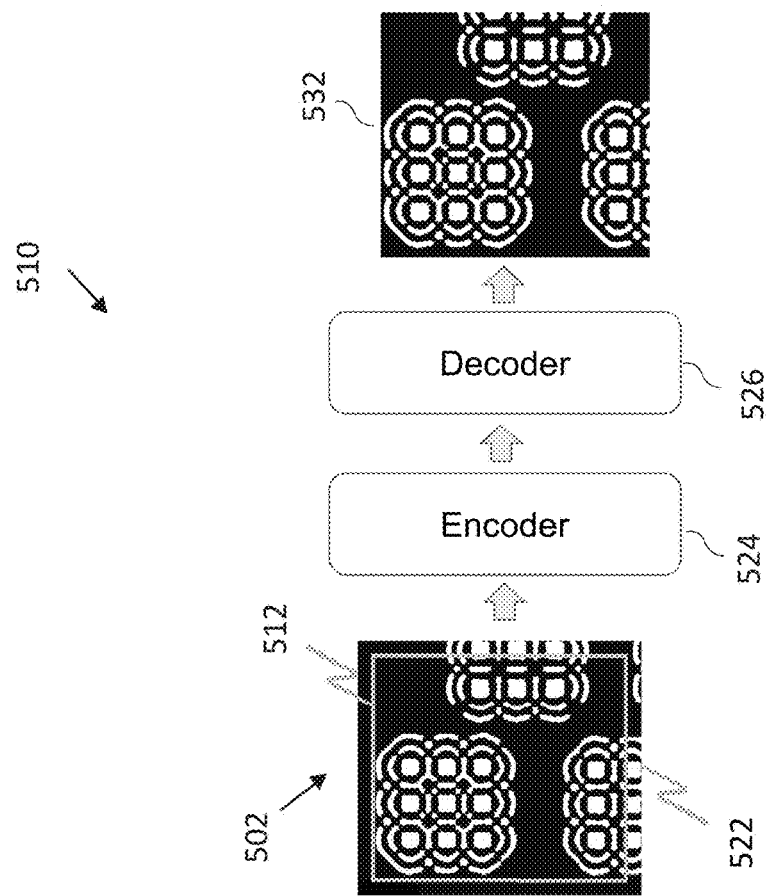
FIGS. 5A-5B show tiling of larger mask/wafer images, in accordance with some embodiments.
Figure 5A:
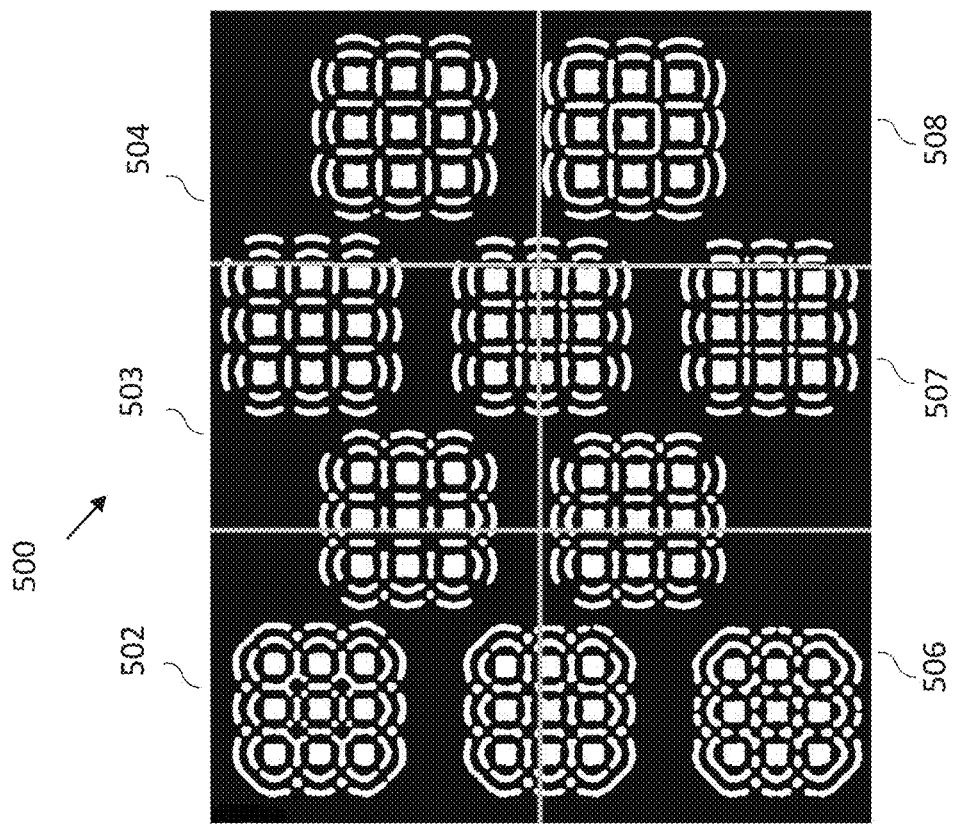

FIG. 5A illustrates some embodiments in which data preparation of a mask dataset supplied for training may include image clips from a full mask or wafer, such as clips of size 240×240×1, to improve processing efficiency. To create these clips, a larger mask/wafer image 500, up to a full mask or full wafer image, may be decomposed into a grid of tiles 502, 503, 504, 506, 507, 508 and encoded on a tile-by-tile basis. To reduce artifacts at tile boundaries, the autoencoder may need a larger input that includes a halo of neighboring pixels, as shown in FIG. 5B, to reduce artifacts in the restored image. The embodiment of FIG. 5B shows tile 502 as the image to be compressed. Tile 502 is separated into a halo region 522 surrounding a tile portion 512, and then the tile portion 512 with the halo 522 is processed by encoder 524 and decoder 526 as described above in relation to FIGS. 2-4. The size of the halo may be a function of the number of convolutional layers and the kernel size of the convolutions. In one embodiment, the maximum halo size could be 6 pixels for an autoencoder containing 2 convolutional layers with kernel size 5×5 and 2 convolutional layers with kernel size 3×3. That is, 2 pixels for each 5×5 layer and 1 pixel for each 3×3 layer. The halo 522 may overlap with adjacent tiles and may be used to recompose the large mask/wafer image 500. The halo 522 may be removed during encoding/decoding of the tile portion 512. In the present embodiment the halo 522 therefore is not present in the decoded image tile 532 as seen in FIG. 5B.

Image normalization, linear scaling to have zero mean and unit variance, and random rotation/flipping of images, cropping and resizing images may be useful to improve data compression. In some embodiments, stochastic optimization of the mask dataset or gradient descent may be used. Data preparation and parameters are fine-tuned for mask data throughout the training process.

After encoding, the image may be decoded and an error analyzed. This error is different from the loss value, in that the error is based on a distance criteria. The error distance calculation is an implementation check to ensure that the compression is accurate, whereas the loss value described above is used to train the autoencoder. In some embodiments, if the error is too large, the encoder/decoder may output the input image instead of the encoded shape data. This allows all encoded/decoded output to have no more than a maximum pre-determined error value. The original input shape data may be output instead of the encoded shape data if the maximum error value of the encoded shape data is greater than a pre-determined maximum error value. For example, the size of the error value can be established by a distance criteria, such as a contour to contour edge placement error (EPE) of 0.1 nm to 4 nm for leading edge semiconductor masks or wafers or greater for other devices such as flat panel displays. In some embodiments the error value may be based on other criteria such as a difference in the amount of dose (energy) applied to the resist surface during manufacturing of a surface or a substrate. In some embodiments, prior to encoding, a neural network may identify whether the input shape is a type of shape that is appropriate for the autoencoder. For example, if a section of the semiconductor design contains a pixelated image of the designer's face, the autoencoder may not have been trained for it. The lossy nature of the method can be contained by another neural network that recognizes input that will not do well, and substitute the input image as the uncompressed output.

The present embodiments enable efficient processing of highly complex data involved with mask and wafer designs. Mask data is tightly structured. The total number of "any possible mask shape" (or wafer shape or design shape) in a given area is vastly limited as compared to the total number of "any possible shape." Furthermore, the total number of "desired mask shape" is even more limited because there are many slight variations of any given desired edge going in and out slightly in both simulated and manufactured contours. An example of why possible mask shapes are so limited is that there are design rules for both masks and wafers that eliminate many geometries that would not be manufacturable. An example of a design rule is that all feature widths may be at least 30 nm. But much more than that, the space of geometries that humans generate as CAD shapes and the space of geometries that OPC/ILT generates as mask designs are extremely limited for multiple reasons. The number of possible shapes can be limited by the way the physics of transistors work. The number of possible shapes can be limited because the electrical connections between transistors need to be as short as possible to minimize resistances and capacitances. Smaller designs are cheaper, which means everything needs to get packed together at minimum intervals and sizes. Lithography, such as the optical lithography typically used to transfer a pattern from a mask to a substrate such as a silicon wafer, has a certain periodicity that forces OPC/ILT to generate or position features at certain pre-specified intervals. In addition to these rigid design rules, each technology node or each manufacturing recipe will have its unique signature in the types of shapes it will have. Shapes that are generated automatically from programs such as OPC/ILT also have certain characteristics, because these programs systemically manipulate their input data, which already have the above stated limitations on possible shapes.

Thus, the design process for masks and wafers is highly restrictive on what shapes are acceptable from all the possible shapes that could be produced. The design process is further complicated by the fact that in simulated or actual manufactured shapes, there are many variations that depend on the neighborhood or that vary because of manufacturing process variation. These factors increase the realm of potential shapes in any given area. The present disclosure recognizes a need to represent all possible mask, wafer, or design shapes much more compactly from this vast difference in possible mask or wafer or design shapes and all possible shapes. Processing of mask and wafer shapes is highly complex, and compressing and decompressing shapes to accurately reproduce a desired shape requires highly specialized techniques because of the nature of the data itself. In the present embodiments the process of encoding an image with the assumption that the image is of a mask, wafer, or design shape captures and encodes similarities among the possible shapes, making it possible to compare and classify shapes for a variety of applications.

A key difficulty for an encoder to vastly compress the information content of a given design, simulated design, or manufactured surface, is whether an accurate "nearly lossless" or "lossless within a reasonable tolerance" result can be found in reasonable computing time. The amount of computing time required while a particular "design" is being processed is the most important. But computing time in programming the encoder—i.e. "training time"—is also important, because for each layer type each design rule (such as "7 nm minimum line width" or "5 nm minimum line-to-line spacing") may need to be independently trained.

By training an autoencoder with mask "knowledge," (e.g., design rules for each layer type) an encoder with 100× or greater compression ratio can be generated in the present embodiments. The present methods can be used to tune the tradeoff of compression ratio and accuracy as measured by comparing the original to the roundtrip result. Tuning for increased accuracy affects the amount of compression. Therefore, the amount of accuracy gain may not be suitable for the amount of compression. For example, a 100× compression with 1 nm worst case loss (data that comes back from roundtrip is at worst 1 nm off from the input data) may be chosen as a suitable loss value threshold for defect detection tasks. The present methods can be used to tune/filter important data to be used to categorize the output. An autoencoder trained specifically with mask "knowledge," for example, to either compress with accuracy or categorize filtered data will perform with more accurate results than a generic autoencoder trained with other images.

Output can be categorized based on the input CAD shapes (which with conventional manufacturing technology are typically rectilinear shapes, but could also include other shapes such as curvilinear shapes), or post-OPC shapes that describe what mask shapes will best generate the shapes on the wafer closest to the desired CAD shapes (e.g., rectilinear or other shapes such as curvilinear, as enabled by multi-beam mask writing that does not have the rectangular limits of VSB-based mask writing). In some embodiments, output may be based off of simulated curvilinear contours, calculated from dose maps indicating amount of dose used to expose a desired. CAD shape.

In some embodiments, computer-aided engineering (CAE) technology can also be applied to scanning electron microscope (SEM) images of physically manufactured masks or wafers. Such an application may aid in automatically categorizing potential defects such as mask defects. In typical semiconductor manufacturing, potential defects on masks are identified by mask inspection, during which an image of the entire mask is generated. That image is fuzzy and relatively low-resolution, but it is of the entire mask. This mask inspection process is designed to identify questionable spots where further inspection is required. Further inspection is done by taking much more accurate SEM images and analyzing these images. This further inspection is accomplished using a defect inspection SEM machine. Defect inspection SEM machines can take very detailed images, but have a limited field of view, such as 1 µm×1 µm to 10 µm×10 µm. Therefore, potential defect areas are first identified in the full-field mask image generated by mask inspection, then details of the potential defect areas are examined in the SEM. In the leading-edge nodes, the number of suspected areas identified as well as the number of actual defects on a typical production mask are much larger than with earlier odes. At the beginning of the $21^{st}$ century, maybe tens of defects on a mask were repaired—masks with more errors than this were discarded and re-manufactured. This has evolved to hundreds of problems being common in leading-edge masks, where all must be repaired. Re-manufacturing of masks has become less common, since a re-manufactured mask will likely also have hundreds of defects. Repairing of defects is unique to mask manufacturing; wafers are not repaired. Masks are worth repairing because an error on the mask will be reproduced on every wafer produced using that mask. Thus, in some embodiments the use of SEM images can be used in training of the neural networks of the present methods to help identify mask defects. In other embodiments simulation of a mask image (e.g., simulated SEM image) may be used in training of the neural networks.

Figure 6:
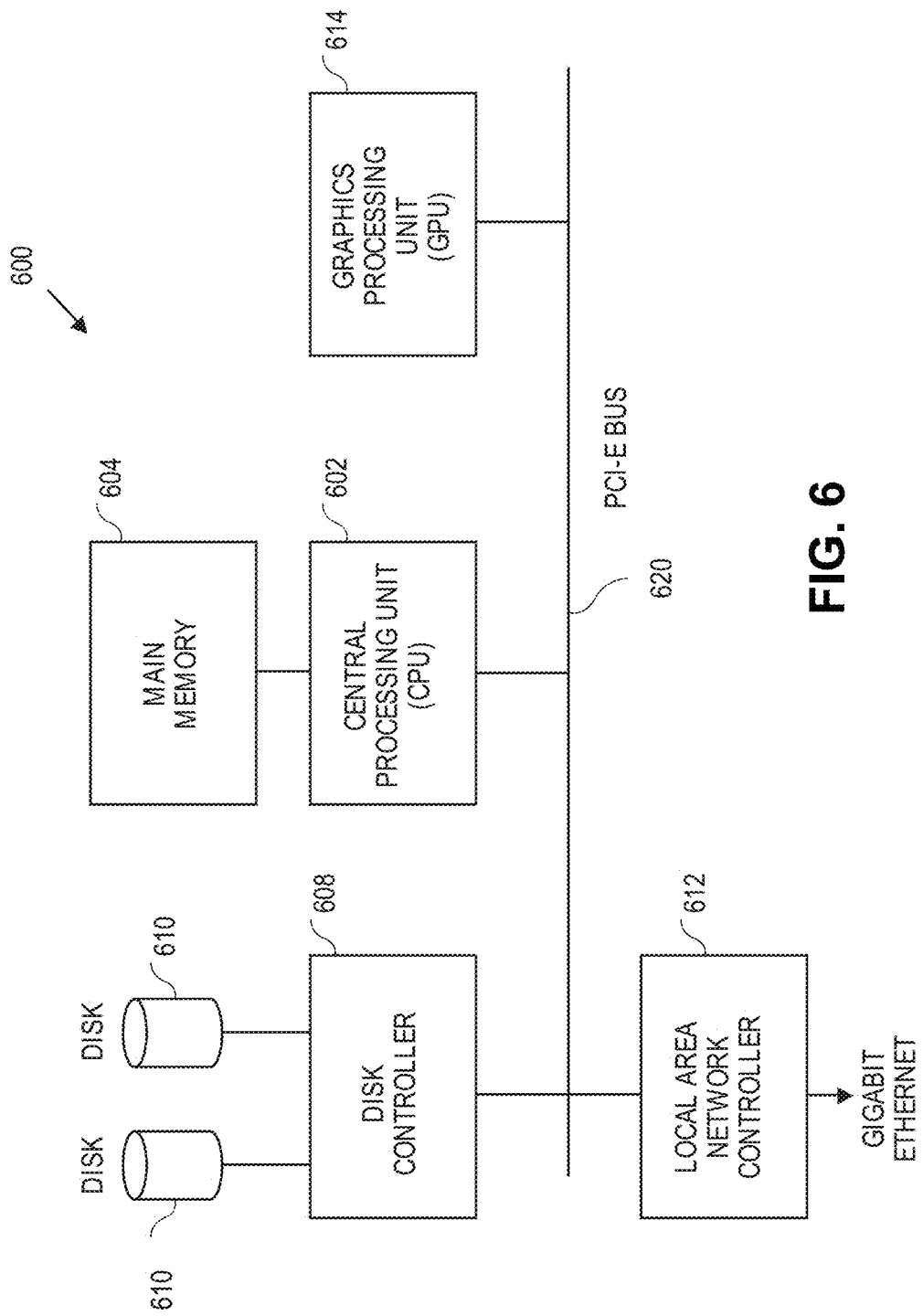
FIG. 6 is a schematic of a GPU system, in accordance with some embodiments.

FIG. 6 illustrates an example of a computing hardware device 600 that may be used to perform the calculations described in this disclosure. Example calculations include processing convolution and deconvolution layers of a neural network, calculating and comparing loss as well as compressing mask data with a trained neural network. Computing hardware device 600 comprises a central processing unit (CPU) 602, with attached main memory 604. The CPU may comprise, for example, eight processing cores, thereby enhancing performance of any parts of the computer software that are multi-threaded. The size of main memory 604 may be, for example, 64 G-bytes. The CPU 602 is connected to a Peripheral Component Interconnect Express (PCIe) bus 620. A graphics processing unit (GPU) 614 is also connected to the PCIe bus. In computing hardware device 600 the GPU 614 may or may not be connected to a graphics output device such as a video monitor. If not connected to a graphics output device, GPU 614 may be used purely as a high-speed parallel computation engine. The computing software may obtain significantly higher performance by using the GPU for a portion of the calculations, compared to using CPU 602 for all the calculations. The CPU 602 communicates with the GPU 614 via PCIe bus 620. In other embodiments (not illustrated) GPU 614 may be integrated with CPU 602, rather than being connected to PCIe bus 620. Disk controller 608 may also be attached to the PCIe bus, with, for example, two disks 610 connected to disk controller 608. Finally, a local area network (LAN) controller 612 may also be attached to the PCIe bus, and provides Gigabit Ethernet (GbE) connectivity to other computers. In some embodiments, the computer software and/or the design data are stored on disks 610. In other embodiments, either the computer programs or the design data or both the computer programs and the design data may be accessed from other computers or file serving hardware via the GbE Ethernet.

Figure 7:
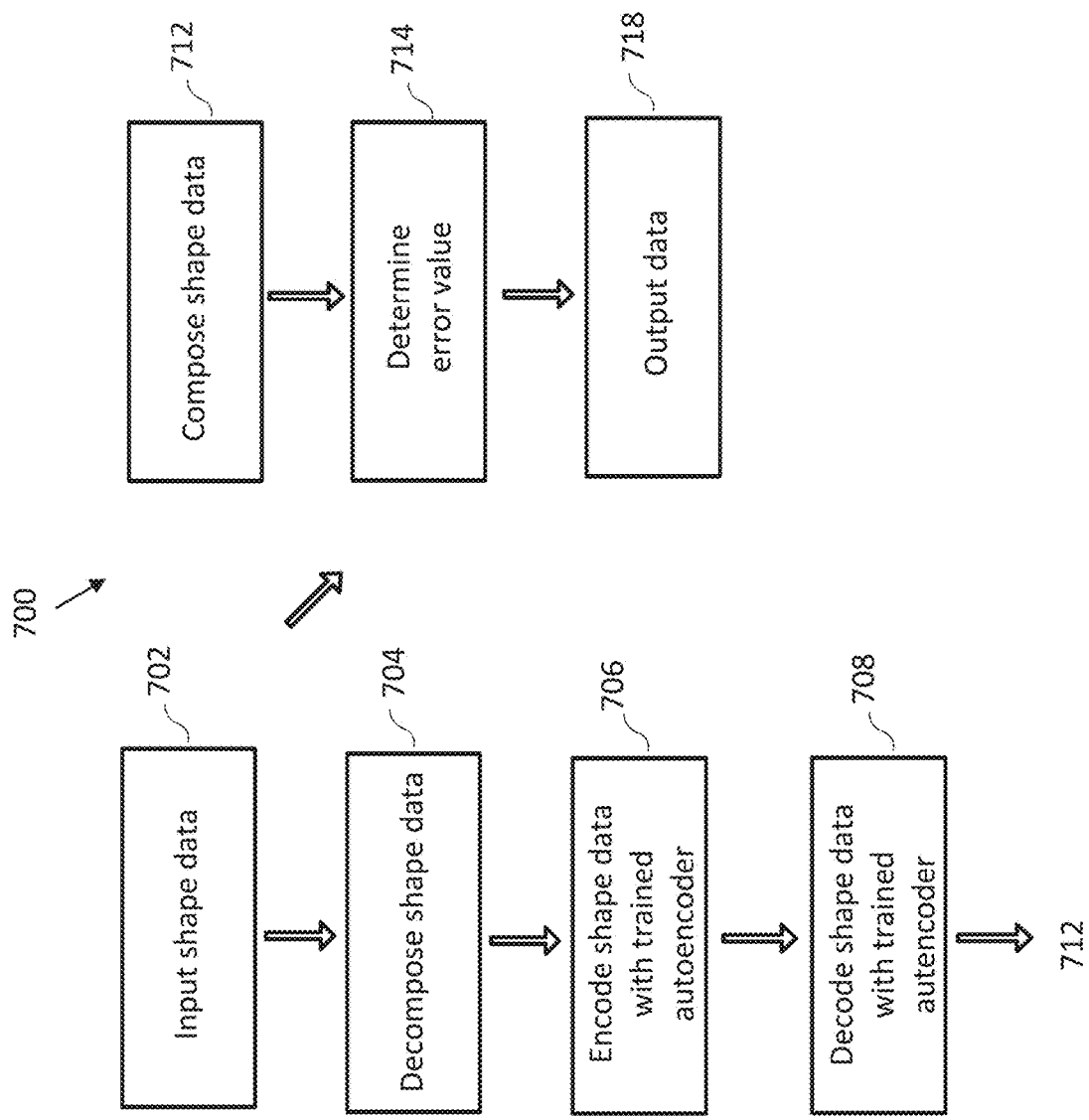
FIG. 7 is a flowchart representing methods for compression of shape data, in accordance with some embodiments.

FIG. 7 is a flowchart 700 representing methods for compression of shape data for a set of electronic designs, in accordance with some embodiments. The flow 700 may use, for example, an autoencoder that has already been trained, such that the convolution layers and other parameters of the autoencoder are pre-determined prior to beginning flow 700. Flow 700 begins with step 702 of inputting a set of shape data, where the set of shape data represents a set of shapes for a device fabrication process. For large images, optional step 704 may be performed to decompose the image into a grid of tiles as discussed in relation to FIGS. 5A-5B. Step 706 involves using a convolutional autoencoder on the set of shape data, where the convolutional autoencoder has a pre-determined set of convolution layers and other parameters, including a kernel size and filter size for each convolution layer. In step 706, the set of shape data is encoded to compress the set of shape data, using the pre-determined set of convolution layers and other parameters (e.g., kernel size, filtered data size, final vector size) of the trained convolutional autoencoder, to create a set of encoded shape data. The set of shape data may include a scanning electron microscope (SEM) image, which may be a simulated mask image, and the set of encoded shape data identifies a mask defect.

In some embodiments of FIG. 7, the encoding with the convolutional autoencoder comprises a flattening step followed by an embedding step, the embedding step involving a fully-connected embedding layer which outputs a one-dimensional vector. The embedding step may use, for example, a single fully-connected embedding layer. The one-dimensional vector may comprise, for example, 256 elements.

In some embodiments of FIG. 7, the set of convolution layers comprises at least two convolution layers, such as four convolution layers or at least four convolution layers. Each of the four convolution layers may use a stride of 2, for example. In some embodiments, the set of convolution layers may include a first convolution layer using a first 5×5 kernel; a second convolution layer following the first convolution layer and using a second 5×5 kernel; a third convolution layer following the second convolution layer and using a first 3×3 kernel; and a fourth convolution layer following the third convolution layer and using a second 3×3 kernel. In such embodiments, the first, second, third and fourth convolutional layers may use filter sizes of, for example, 32, 64, 128 and 256, respectively.

In some embodiments of FIG. 7, the methods include decoding the set of encoded shape data in step 708 into decoded data using the convolutional autoencoder.

In some embodiments of FIG. 7, the set of shape data comprises a grid of tiles decomposed in step 704 from a larger image; and the encoding comprises encoding the grid of tiles on a tile-by-tile basis to be recomposed in step 712. Each of the tiles in the grid of tiles may include a halo, the halo having a size chosen based at least one of: the number of convolution layers and the kernel size of the convolution layers.

In some embodiments, the methods include determining an error value in step 714. In some embodiments, determining the error value in step 714 for the set of encoded shape data includes determining the size of the error value established by a distance criteria, such as a contour to contour edge placement error, and outputting the input set of shape data instead of the set of encoded shape data in step 718 if the error value of the set of encoded shape data is greater than a pre-determined threshold. The error may be based on, for example, a distance criterion or a difference in dose energy to manufacture the set of shape data on a surface. In some embodiments, the encoded shape data in step 718 provides additional information on the input shape data, for example a classification of a mask defect for a SEM image.

In some embodiments, the device fabrication process is a semiconductor fabrication process or a flat-panel display fabrication process.

Figure 8:
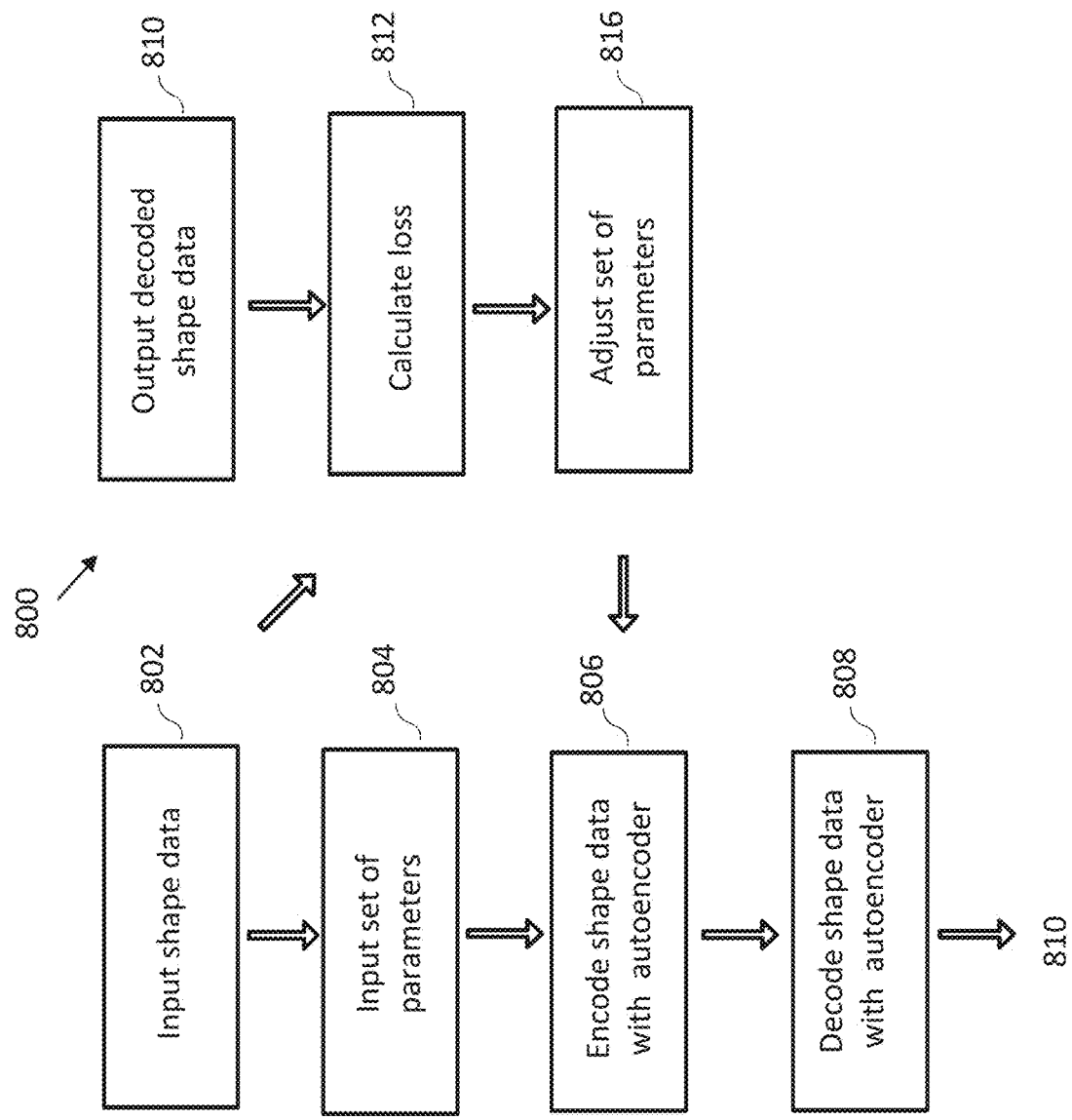
FIG. 8 is a flowchart representing methods for compression of shape data, in accordance with some embodiments.

FIG. 8 is a flowchart 800 representing training a neural network to compress shape data for a set of electronic designs, in accordance with some embodiments. Flow 800 begins with step 802 of inputting a set of shape data, where the set of shape data represents a set of shapes for a device fabrication process. Step 804 involves inputting a set of parameters which may include a set of convolution layers for a convolutional autoencoder, with a kernel size, a stride value and filter size for each layer. Step 806 involves encoding the input set of shape data to compress the set of shape data, using the input set of convolution layers of the convolutional autoencoder, to create a set of encoded shape data. Some embodiments include determining a vector size for the set of encoded shape data. Step 808 involves decoding the set of encoded shape data into decoded data using the convolutional autoencoder and outputting the decoded shape data 810. Step 812 involves calculating a loss by comparing input shape data 802 with decoded shape data 810. Step 816 involves adjusting the input set of parameters to determine an updated set of convolution layers for the convolutional autoencoder, based on the calculated loss, and using the new adjusted parameters (including the updated set of convolution layers) to encode shape data in step 806. The loop from steps 806 to 816 are repeated until an acceptable loss is consistently achieved. The set of convolution layers established from flow 800—which may be the set of convolution layers input in step 804 or the updated set of convolution layers from the training loop of steps 806 to 816—can be used as the pre-determined set of convolution layers in step 706 of FIG. 7.

In some embodiments of FIG. 8, the loss in step 812 is calculated as a Mean Square Error (MSE) as the metric for comparison and calculation of data loss, or alternatively a similar Root Mean Square Error (RMSE) loss function. In some embodiments, the methods include initializing the set of parameters for the convolutional autoencoder prior to the inputting of the set of convolution layers, such as initializing a set of parameters to use in step 804. In some embodiments, the set of shape data comprises a grid of tiles as in FIG. 7, decomposed in step 704 from a larger image; and the encoding and decoding comprises encoding and decoding the grid of tiles on a tile-by-tile basis.

While the specification has been described in detail with respect to specific embodiments, it will be appreciated that those skilled in the art, upon attaining an understanding of the foregoing, may readily conceive of alterations to, variations of, and equivalents to these embodiments. These and other modifications and variations to the present methods may be practiced by those of ordinary skill in the art, without departing from the scope of the present subject matter, which is more particularly set forth in the appended claims. Furthermore, those of ordinary skill in the art will appreciate that the foregoing description is by way of example only, and is not intended to be limiting. Steps can be added to, taken from or modified from the steps in this specification without deviating from the scope of the invention. In general, any flowcharts presented are only intended to indicate one possible sequence of basic operations to achieve a function, and many variations are possible. Thus, it is intended that the present subject matter covers such modifications and variations as come within the scope of the appended claims and their equivalents.

What is claimed is:

1. A method for compression of shape data for a set of electronic designs, the method comprising:
   inputting a set of shape data, wherein the set of shape data comprises mask designs; and
   encoding the set of shape data using a convolutional autoencoder, wherein the encoding compresses the set of shape data to produce a set of encoded shape data;
   wherein the convolutional autoencoder comprises a set of adjusted parameters comprising weights, wherein the set of adjusted parameters has been tuned for increased accuracy of the set of encoded shape data using the weights, wherein the weights are used to determine what information to keep based on design rules for the set of electronic designs.

2. The method of claim 1, wherein the encoding with the convolutional autoencoder comprises a flattening step followed by an embedding step, the embedding step involving a fully-connected embedding layer which outputs a one-dimensional vector.

3. The method of claim 2, wherein the one-dimensional vector comprises 256 elements.

4. The method of claim 1, wherein the convolutional autoencoder comprises a pre-determined set of convolution layers, including a kernel size and a filter size for each convolution layer in the pre-determined set of convolution layers.

5. The method of claim 4, wherein the pre-determined set of convolution layers comprises:
   a first convolution layer using a first 5×5 kernel;
   a second convolution layer following the first convolution layer and using a second 5×5 kernel;
   a third convolution layer following the second convolution layer and using a first 3×3 kernel; and
   a fourth convolution layer following the third convolution layer and using a second 3×3 kernel.

6. The method of claim 5, wherein the first, second, third and fourth convolutional layers use filter sizes of 32, 64, 128 and 256, respectively.

7. The method of claim 5, wherein a stride of 2 is used in each of the four convolution layers.

8. The method of claim 1, further comprising decoding the set of encoded shape data into decoded shape data using the convolutional autoencoder, wherein the decoded shape data reproduces the input set of shape data within a pre-determined threshold.

9. The method of claim 1, wherein:
   the set of shape data comprises a grid of tiles decomposed from a larger image; and
   the encoding comprises encoding the grid of tiles on a tile-by-tile basis, forming an encoded grid of tiles.

10. The method of claim 9, wherein each tile in the grid of tiles comprises a halo to reduce artifacts at a boundary of the tile, the halo being a region of neighboring pixels surrounding the tile, the halo having a size chosen based on at least one of: a number of convolution layers of the convolutional autoencoder and a kernel size of the convolution layers of the convolutional autoencoder.

11. The method of claim 9, further comprising:
   determining an error value for a tile in the encoded grid of tiles; and
   outputting a tile in the grid of tiles instead of the tile in the encoded grid of tiles when the error value of the tile in the encoded grid of tiles is greater than a pre-determined threshold.

12. The method of claim 11, wherein the error value is based on a distance criterion to manufacture the set of shape data on a surface, wherein the distance criterion is based on the design rules.

13. The method of claim 11, wherein the error value is based on a difference in dose energy to manufacture the set of shape data on a surface, wherein the difference in dose energy is based on the design rules.

14. The method of claim 1, wherein the set of shape data further comprises simulated mask designs.

15. The method of claim 1, wherein the design rules comprise a minimum line width or a minimum line-to-line spacing.

16. The method of claim 1, wherein the set of adjusted parameters is tuned for increased accuracy in a tradeoff of compression ratio and accuracy gain.

17. A method for training a convolutional autoencoder for compression of shape data for a set of electronic designs, the method comprising:
   inputting a set of shape data, wherein the set of shape data comprises mask designs;
   inputting a set of parameters including a set of convolution layers for a convolutional autoencoder, wherein the set of parameters is determined using design rules for the set of electronic designs, and wherein the set of parameters comprises weights;
   encoding the set of shape data to compress the set of shape data, using the set of convolution layers of the convolutional autoencoder, to produce a set of encoded shape data; and
   adjusting the set of parameters, wherein the adjusting comprises tuning the set of parameters for increased accuracy of the set of encoded shape data, and wherein the adjusting comprises adjusting the weights to retain important information needed, based on the design rules for the set of electronic designs, to reproduce the input set of shape data.

18. The method of claim 17, wherein the set of parameters comprises at least one of: a kernel size, a stride value and a filter size for each convolution layer.

19. The method of claim 18, further comprising determining a vector size for the set of encoded shape data.

20. The method of claim 17, further comprising decoding the set of encoded shape data into decoded data, using the convolutional autoencoder.

21. The method of claim 20, further comprising calculating a loss by comparing the decoded data with the input set of shape data.

22. The method of claim 21, further comprising adjusting the set of parameters based on the loss.

23. The method of claim 20 wherein:
   the set of shape data comprises a grid of tiles decomposed from a larger image; and
   the encoding and the decoding comprise encoding and decoding the grid of tiles on a tile-by-tile basis.

24. The method of claim 17, further comprising initializing the set of parameters for the convolutional autoencoder prior to the inputting of the set of parameters including the set of convolution layers.

25. The method of claim 17, wherein the design rules comprise a minimum line width or a minimum line-to-line spacing.

* * * * *